(12) United States Patent
Hyobu et al.

(10) Patent No.: US 7,722,095 B2
(45) Date of Patent: May 25, 2010

(54) LID UNIT FOR THIN-PLATE HOLDING CONTAINER, THIN-PLATE HOLDING CONTAINER, AND SIMPLIFIED ATTACHING/DETACHING MECHANISM

(75) Inventors: Yukihiro Hyobu, Tokyo (JP); Chiaki Matsutori, Nishigoushi-machi (JP); Tadahiro Obayashi, Yamaga (JP)

(73) Assignee: Miraial Co., Ltd. (JP)

( * ) Notice: Subject to any disclaimer, the term of this patent is extended or adjusted under 35 U.S.C. 154(b) by 1442 days.

(21) Appl. No.: 11/104,620

(22) Filed: Apr. 13, 2005

(65) Prior Publication Data
US 2005/0173296 A1  Aug. 11, 2005

Related U.S. Application Data

(62) Division of application No. 10/432,771, filed as application No. PCT/JP01/06347 on Jul. 23, 2001, now Pat. No. 7,048,127.

(51) Int. Cl.
*E05C 5/00* (2006.01)
(52) U.S. Cl. .................. 292/66; 292/138; 292/145; 292/302; 220/323; 220/324; 220/326
(58) Field of Classification Search .............. 292/66, 292/64–65, 67–80, 138, 140, 143, 145–147, 292/150, 302, DIG. 11, DIG. 53, DIG. 54, 292/DIG. 64; 220/323, 324, 326; 70/127, 70/134
See application file for complete search history.

(56) References Cited

U.S. PATENT DOCUMENTS 5,915,562 A * 6/1999 Nyseth et al. ............... 206/710

5,931,512 A * 8/1999 Fan et al. ..................... 292/66
5,957,292 A * 9/1999 Mikkelsen et al. .......... 206/710

(Continued)

FOREIGN PATENT DOCUMENTS

EP        1 043 758 A2    5/2000

(Continued)

*Primary Examiner*—Peter Cuomo
*Assistant Examiner*—Mark Williams
(74) *Attorney, Agent, or Firm*—Bacon & Thomas, PLLC

(57) ABSTRACT

The present invention provides a lid unit for closing the container body 2 that is transported with thin-plates such as semiconductor wafers or the like accommodated therein. Simplified attaching/detaching mechanisms 32 for the production line are provided at the centers of the respective sides opposing with respect to each other. The simplified attaching/detaching mechanism 32 for the production line includes a locking plate 34 for locking the second fitted portion 21 and a drive-out member 35 for allowing the drive-out member 35 to rise and set by being engaged with the locking plate 34. A locking arm 57 for fixing the drive-out member 35 is provided on the drive-out member 35 at the end in the direction of rotation. A supporting rail 56 for controlling the rising and setting movement of the locking plate 34 is provided on the drive-out member 35. The locking plate 34 is supported pivotally and slidably, and is provided with a holding claw 51 for engaging the second fitted portion 21 at the distal end thereof. The thin-plate holding container 1 is used for transportation when the lid unit 4 for transportation is attached on the container body 2, and is used for the production line when the lid body 5 for the production line is attached thereon.

4 Claims, 14 Drawing Sheets

U.S. PATENT DOCUMENTS

| | | | |
|---|---|---|---|
| 6,105,782 A * | 8/2000 | Fujimori et al. | 206/710 |
| 6,419,482 B1 * | 7/2002 | Sakata et al. | 432/250 |
| 6,622,883 B1 * | 9/2003 | Wu et al. | 220/323 |
| 6,880,718 B2 * | 4/2005 | Eggum | 220/323 |
| 6,902,063 B2 * | 6/2005 | Pai et al. | 206/710 |
| 7,048,127 B2 * | 5/2006 | Hyobu et al. | 206/710 |
| 7,077,270 B2 * | 7/2006 | Matsutori | 206/710 |
| 7,168,587 B2 * | 1/2007 | Eggum | 220/323 |
| 7,182,203 B2 * | 2/2007 | Burns et al. | 206/710 |
| 7,455,181 B2 * | 11/2008 | Matsutori et al. | 206/710 |

FOREIGN PATENT DOCUMENTS

| | | |
|---|---|---|
| EP | 1195807 | 4/2002 |
| JP | 2000-289795 | 10/2000 |
| JP | 2001-158499 | 6/2001 |
| WO | 99/28952 | 6/1999 |

* cited by examiner

LID UNIT FOR THIN-PLATE HOLDING CONTAINER, THIN-PLATE HOLDING CONTAINER, AND SIMPLIFIED ATTACHING/DETACHING MECHANISM

CROSS-REFERENCE TO RELATED APPLICATIONS

This application is a division of U.S. Ser. No. 10/432,771 filed May 27, 2003, now U.S. Pat. No. 7,048,127, which is a National Phase Application (35 USC 371) of PCT/JP01/006347 filed Jul. 23, 2001.

TECHNICAL FIELD

The present invention relates to a lid unit for a thin-plate holding container, the thin-plate holding container, and a simplified attaching/detaching mechanism therefor, which enable a container body for accommodating thin-plates such as semiconductor wafers, memory disks or liquid crystal glasses for storage or transportation to be used in a manufacturing process after transportation.

BACKGROUND ART

In general, a thin-plate holding container for accommodating thin-plates such as semiconductor wafers or the like for storage or transportation is publicly known.

Such thin-plate holding container mainly includes a container body, and a lid unit for covering the upper opening of the container body. The container body is provided with members for supporting the thin-plates such as semiconductor wafers or the like therein. Such thin-plate holding container requires to be kept clean inside thereof during transportation in order to prevent contamination or the like on the surface of the thin-plates such as semiconductor wafers or the like accommodated therein. Therefore, the container is sealed off. In other words, the lid unit is fixed to the container body for sealing the interior of the container off. There are various structures for fixing the lid unit to the container body.

The plates are stored in the container body and the lid unit is fixed to the container body for sealing the interior thereof off in a plant for manufacturing plates such as semiconductor-wafers. In this state, the containers are transported to a semiconductor manufacturing plant or the like. Generally, in the semiconductor manufacturing plant, the semiconductor wafers or the like are transferred to a specific container for production line, and placed on a production line.

When transferring the semiconductor wafers or the like into the line-specific container as described above, the above-described thin-plate holding container is used only for transportation, and thus is not necessary after transportation. Therefore, such thin-plate holding containers, after having been emptied, are returned to the originated plant or discarded. However, it is inefficient in terms of usage, and may result in waste of resources and increase of waste products.

Therefore, the present inventor has proposed an invention in which a lid unit receiving portion of the container body is improved so as to be capable of being fitted to various types of lid unit, whereby the container body can also be used in the production line before (Japanese Unexamined Patent Application Publication No. 2000-289795). However, there remains a problem in that container bodies having structures different from such container body cannot be used in the production line.

In view of such circumstances, an object of the present invention is to provide a lid unit for a thin-plate holding container body which allows the container body to also be used, as is, in the production line after transportation and the like.

DISCLOSURE OF INVENTION

A lid unit for thin-plate holding containers according to a first aspect of the invention is a lid unit for closing the container body that is transported with a plurality of thin-plates accommodated therein, characterized by being formed into a square shape and provided with a simplified attaching/detaching mechanism for the production line at the center of each opposing side.

In such a structure, since a simplified attaching/detaching mechanism for the production line is provided on the lid unit, a lid unit for the production line may be attached via the simplified attaching/detaching mechanism for production line on the container body provided for transportation. As a consequence, the container body for transportation can be used as a container body for the production line as is.

The aforementioned simplified attaching/detaching mechanism for the production line preferably includes: a locking plate for projecting and engaging the container body; and a drive-out member for allowing the locking plate to rise and set by being engaged with the locking plate.

Accordingly, the lid unit for the production line may be attached to and detached from the container body by allowing the locking plate to rise and set by the drive-out member.

A locking arm is preferably provided on the aforementioned drive-out member at the end in the direction of rotation.

Accordingly, the drive-out member may be reliably fixed at the predetermined position after being rotated.

The aforementioned drive-out member is preferably provided with a supporting rail for controlling the rising and setting movement of the locking plate.

Accordingly, the rising and setting movement of the locking plate is controlled by the supporting rail and thus the lid unit may be reliably fixed and reliably released from fixation.

The locking plate is preferably supported pivotally and slidably.

Accordingly, the lid unit may be reliably fixed to the container body by allowing the locking plate to slide into the container body, and to pivot to be brought into contact with the container body.

The aforementioned locking plate is preferably provided with a holding claw to be engaged with the container body at the distal end thereof.

Accordingly, the lid unit may be pressed toward and reliably fixed to the container body by engaging the holding claw with the container body.

The thin-plate holding container according to a second aspect of the invention includes: a container body that is transported with a plurality of thin-plates accommodated therein; and a lid unit for closing the container body, characterized in that the lid unit for the thin-plate holding container as described above is used as said lid unit.

In such a structure, the thin-plate holding container may be used for the production line in the plant or the like after having been used for transportation.

BEST MODE FOR CARRYING OUT THE INVENTION

Figure 1:
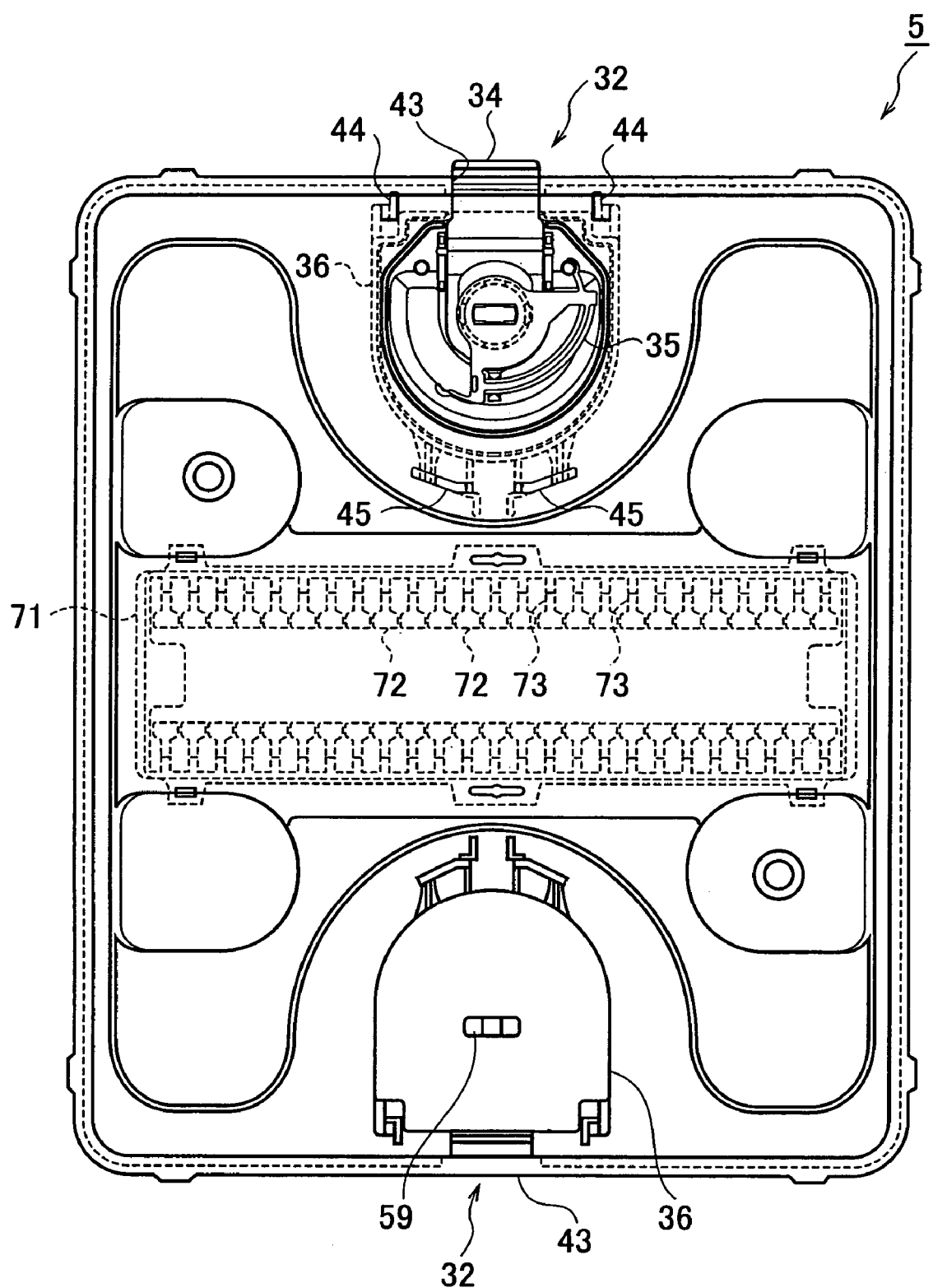
FIG. 1 is a plan view of a lid unit for a production line according to an embodiment of the present invention.

Referring now to the drawings, an embodiment of the present invention will be described. A thin-plate holding container of the present invention is devised in such a manner that thin-plates such as semiconductor wafers, memory disks, liquid crystal glasses and the like may be accommodated for storage and transportation, and a container body may be used in the production line and the like as is after transportation. In this description, a thin-plate holding container for accommodating semiconductor wafers is taken as an example.

Figure 2:
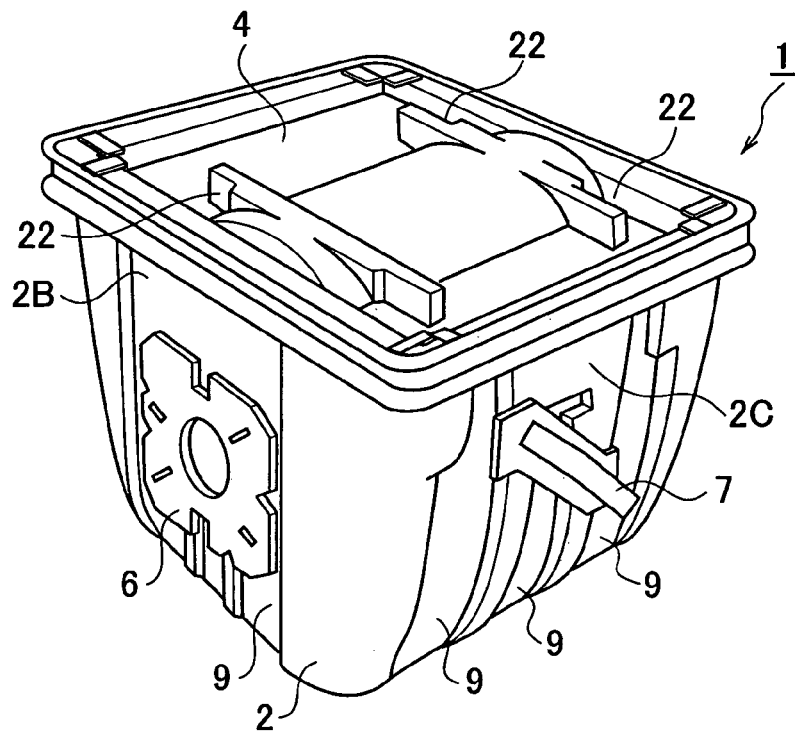
FIG. 2 is a perspective view showing a thin-plate holding container for transportation.
Figure 3:
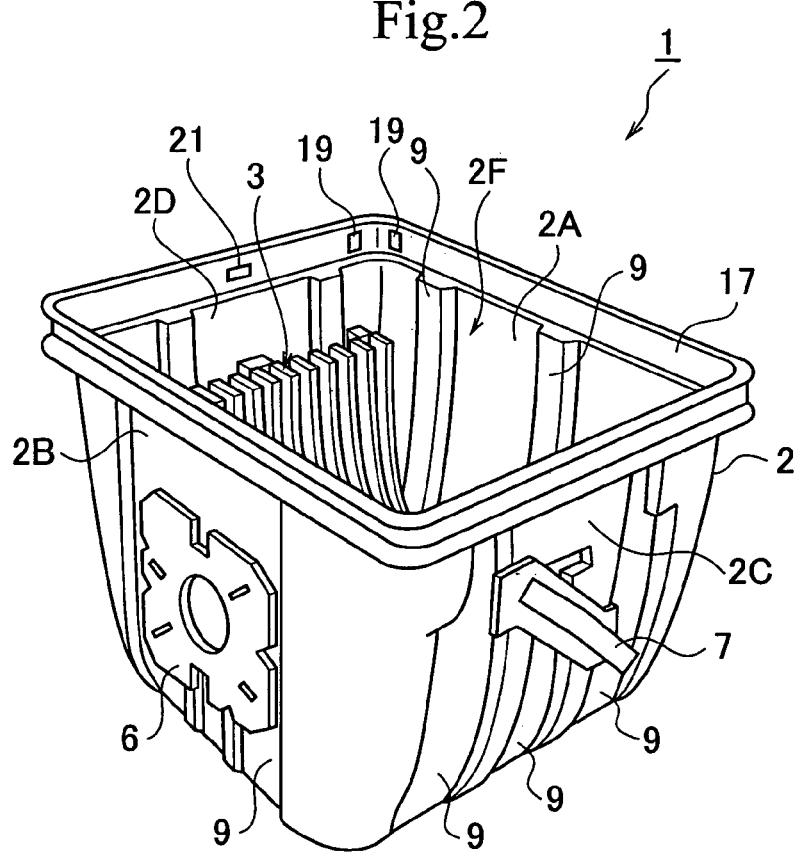
FIG. 3 is a perspective view showing a container body of the thin-plate holding container.

The thin-plate holding container 1 according to the present embodiment includes, as shown in FIGS. 1, 2 and 3, a container body 2 for accommodating a plurality of semiconductor wafers (not shown) therein, two thin-plate holding portions 3 provided on both opposite side walls in the container body 2 for holding the semiconductor wafer accommodated therein from both sides, a lid unit 4 for transportation and a lid unit 5 for the production line for closing the container body 2, a top flange 6 to be gripped by an arm portion of a transporting device (not shown) in a plant, and a carrying handle 7 to be held by an operator when he/she carries the thin-plate holding container 1 by hand.

Figure 4:
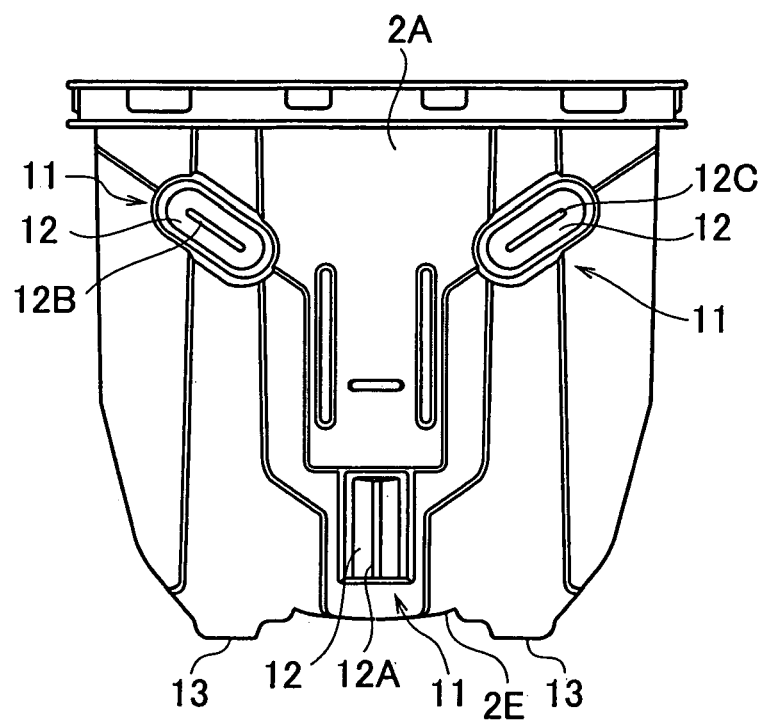
FIG. 4 is a bottom view showing the container body of the thin-plate holding container.
Figure 5:
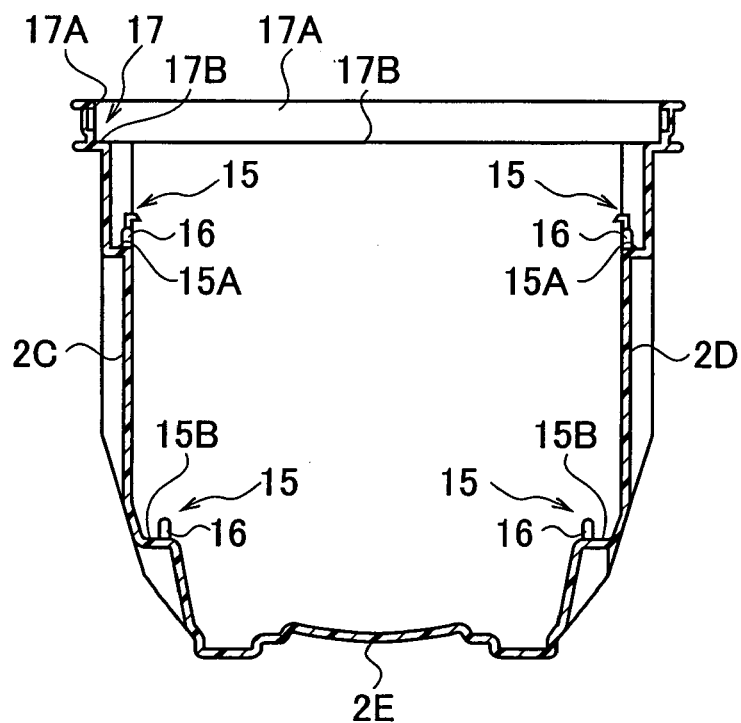
FIG. 5 is a cross sectional view showing the container body of the thin-plate holding container.

The container body 2 is generally formed into a cubic shape as a whole as shown in FIGS. 3 to 5. The container body 2 is, in the state of being vertically placed (the state shown in FIG. 3), constructed of four sidewall portions 2A, 2B, 2C and 2D that corresponds to a peripheral wall and a bottom plate portion 2E, and includes an opening 2F on top thereof. The respective sidewall portions 2A, 2B, 2C and 2D are formed with a number of reinforcing vertical grooves 9. The container body 2 is placed laterally when being installed so as to face toward a wafer transporting robot (not shown) in the semiconductor wafer production line or the like. Outside the sidewall portion 2A that corresponds to the bottom when being placed laterally, there are provided a positioning unit 11 for the thin-plate holding container 1. Outside the sidewall portion 2B that corresponds to a top ceiling when being placed laterally, there is provided a top flange 6 so as to be detachable. Outside the sidewall portions 2C and 2D, which correspond to sidewall portion when placed laterally, a carrying handle 7 is detachably mounted. The carrying handle 7 is not limited to a bar-shaped handle, and may be other shapes such as a round grip handle and the like.

The aforementioned positioning unit 11 is constructed mainly of three fitting grooves 12. Each fitting groove 12 includes a first fitting groove 12A for aligned with the vertical direction of the container body 2, and a second and a third fitting grooves 12B and 12C inclined by the same angle (about 60 degrees) with respect to the vertical direction of the container body 2. These three fitting grooves 12 are formed with high degree of accuracy according to the standard. The thin-plate holding container 1 is may be positioned accurately by fitting the respective fitting grooves 12A, 12B and 12C of the positioning unit 11 to fitting projections (not shown) on the mounting base side, so that the semiconductor wafers may be taken in and out by the wafer transporting robot.

The bottom plate portion 2E is provided with legs 13. The respective legs 13 are formed into square shapes projecting downward from four corners of the bottom plate portion 2E. When the container body 2 is placed vertically, the container body 2 is stably supported by these four legs 13.

Supporting bases 15 for supporting the thin-plate holding portion 3 to be detachably mounted thereto are provided inside the sidewall portions 2C and 2D of the container body 2. Each supporting base 15 is constructed of a lower base portion 15A and an upper base portion 15B. Each respective supporting base 15 is provided with a supporting projection 16. The supporting projection 16 is fitted to the thin-plate, holding portion 3 to support the thin-plate holding portion 3.

Figure 6:
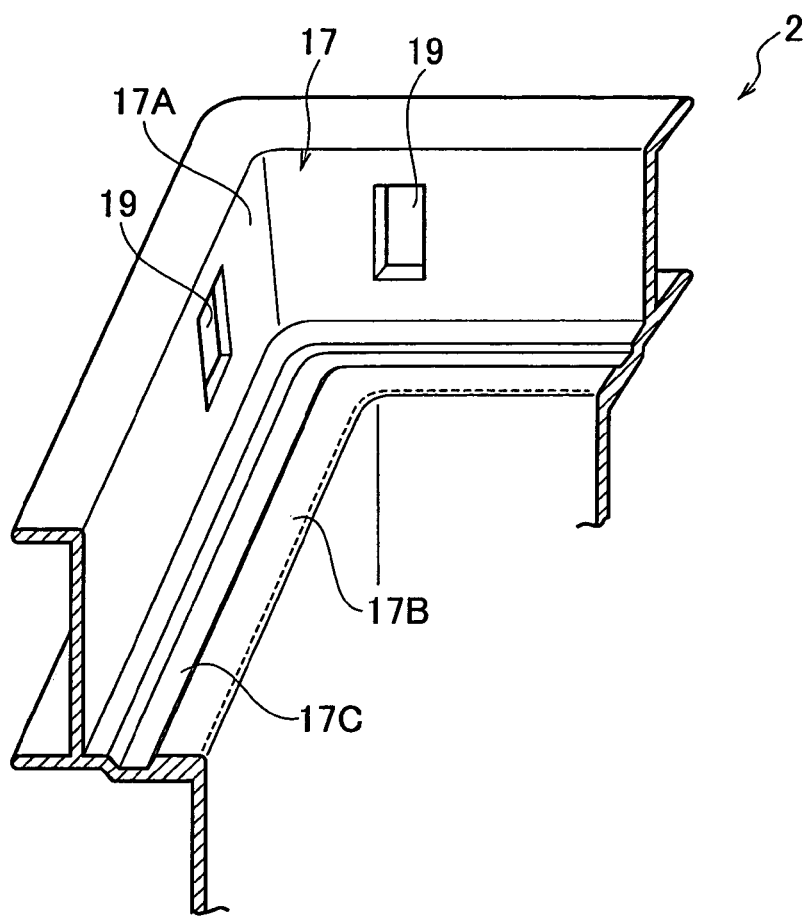
FIG. 6 is a perspective view of a principal portion showing a container body of the thin-plate holding container.
Figure 7:
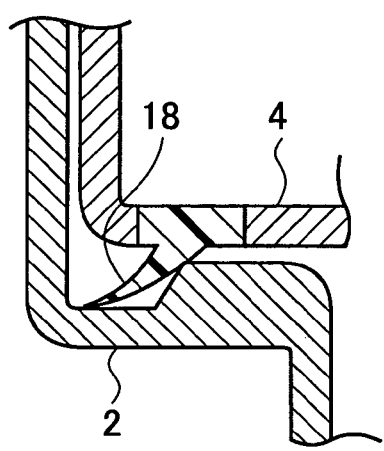
FIG. 7 is a cross sectional view showing a principal portion of a contact portion between the lid unit for transportation and the container body.

As shown in FIG. 6 and FIG. 7, a lid unit receiving portion 17 to which the lid unit 4 is fitted is provided at the upper end of the container body 2. The lid unit receiving portion 17 is formed by broadening the upper end of the container body 2 to the dimensions corresponding to the lid unit 4. Accordingly, the lid unit 4 is fitted to the inside of a vertical plate 17A of the lid unit receiving portion 17, and thus abuts on a horizontal plate 17B thereof, so as to be capable of being attached to the lid unit receiving portion 17. The horizontal plate 17B is further provide with a seal groove 17c around the whole periphery thereof, so that a gasket 18 mounted to the lower surface of the lid unit 4 fits to seal the interior of the thin-plate holding container 1. The inner surface of the vertical plate 17A is formed with first fitted portions 19 to which lid unit locking claws 24 of the simplified attaching/detaching mechanism 23 for transportation, which will be described later, fit to fix the lid unit 4 to the container body 2. The first fitted portions 19 are formed by depressing the vertical plate 17A into a square shape, so that lid unit locking claws 24, which will be described later, are fitted to the inner upper surface thereof.

At the centers of the vertical plates 17A on the side of the sidewall portions 2C and 2D, there are formed of second fitted portions 21, as shown in FIG. 3. The second fitted portions 21 are used in the production line. The second fitted portions 21 are adapted in such a manner that the locking plate 34 of the simplified attaching/detaching mechanism 32 for the production line of the lid unit 5 for the production line is fitted to fix the lid unit 5 for the production line to the container body 2. The second fitted portions 21 are formed at the positions, into the shapes and dimensions as specified in the standard.

Figure 8:
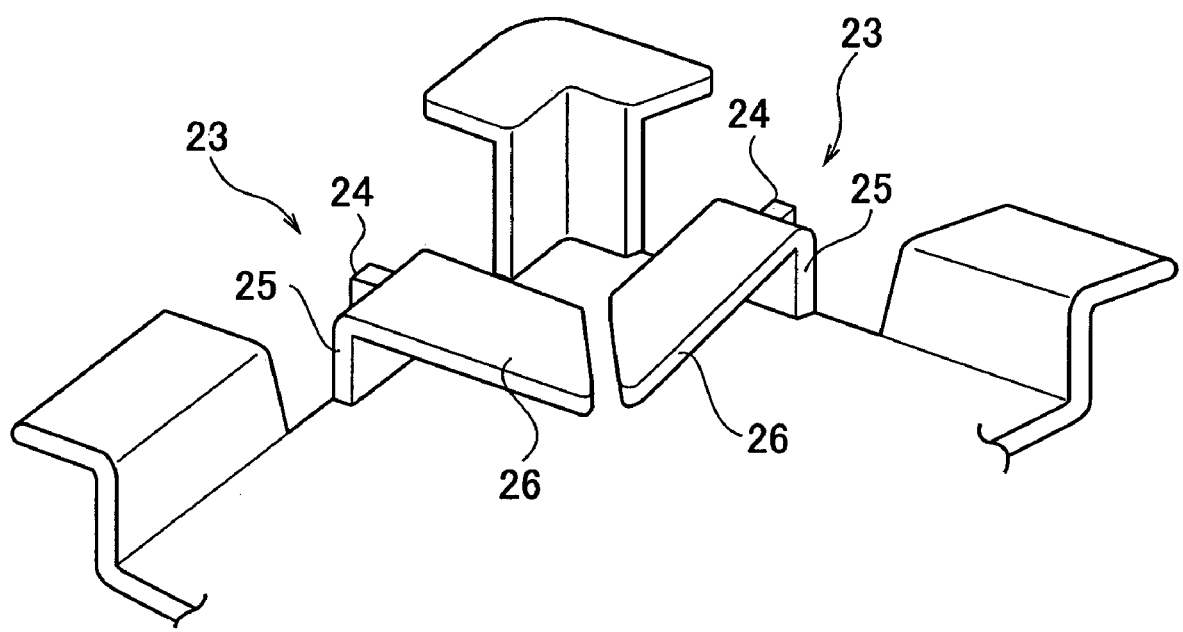
FIG. 8 is a perspective view showing a simplified attaching/detaching mechanism for transportation on the lid unit for transportation.

The lid unit 4 for transportation is a publicly known lid unit, and is constructed as shown in FIGS. 2, 7 and 8. The lid unit 4 for transportation is formed into a dish shape and the central portion thereof is raised into a cylindrical shape so as not to come into contact with the upper portion of the semiconductor wafer to be accommodated therein. The upper surface of the lid unit 4 is further formed with leg receiving portions 22, to which the legs 13 formed at the bottom of the container body 2 are fitted, at four positions thereof.

The lid unit 4 is provided at four corners thereof with the simplified attaching/detaching mechanism 23 for transportation for detachably fixing the lid unit 4 for transportation to the container body 2. The simplified attaching/detaching mechanism 23 for transportation mainly constructed of a lid unit locking claw 24 formed so as to be projected from the peripheral edge of the lid unit 4 for transportation, a flexible supporting plate 25 to which the lid unit locking craw 24 is attached, and a releasing plate 26 extending from the supporting plate 25 horizontally for releasing the lid unit locking claw 24 by being pressed by the operator with his/her finger.

The lid unit 5 for the production line is a lid unit that enables the container body 2 of the transported thin-plate holding container 1 to be used in the production line in the plant as is. The lid unit 5 for the production line is stored in the semiconductor manufacturing plant and the like as a single product independently of the aforementioned thin-plate holding container 1. The lid unit 5 for the production line is constructed as shown in FIG. 1 and FIGS. 9 to 11.

The lid unit 5 for the production line is generally formed into a square shallow dish shape as a whole, so that it does not overhang outward in a state of being attached to the lid unit receiving portion 17 of the container body 2. The lid unit 5 for the production line is provided with a gasket receiving portion 31 attached around the lower portion thereof. The gasket receiving portion 31 is provided with a gasket (not shown), and seals the interior of the container body 2 by fitting into the seal groove 17C in a state in which the lid unit 5 for the production line is attached to the lid unit receiving portion 17. The gasket is formed as appropriate corresponding to the shape of the seal groove 17C. Since the seal groove 17C may not be formed into the shape of simple groove, the gasket is to be formed into the shape corresponding to the shape of the groove.

On the upper surface of the lid unit 5 for the production line at the centers of the edges of the longitudinal end portions thereof, there are provided simplified attaching/detaching mechanism 32 for the production line for detachably fixing the lid unit 5 for the production line to the container body 2. The positions of the simplified attaching/detaching mechanism 32 for the production line are set according to the standard. The simplified attaching/detaching mechanism 32 for the production line includes a body recess 33, a locking plate 34, drive-out member 35 and a cover 36.

Figure 9:
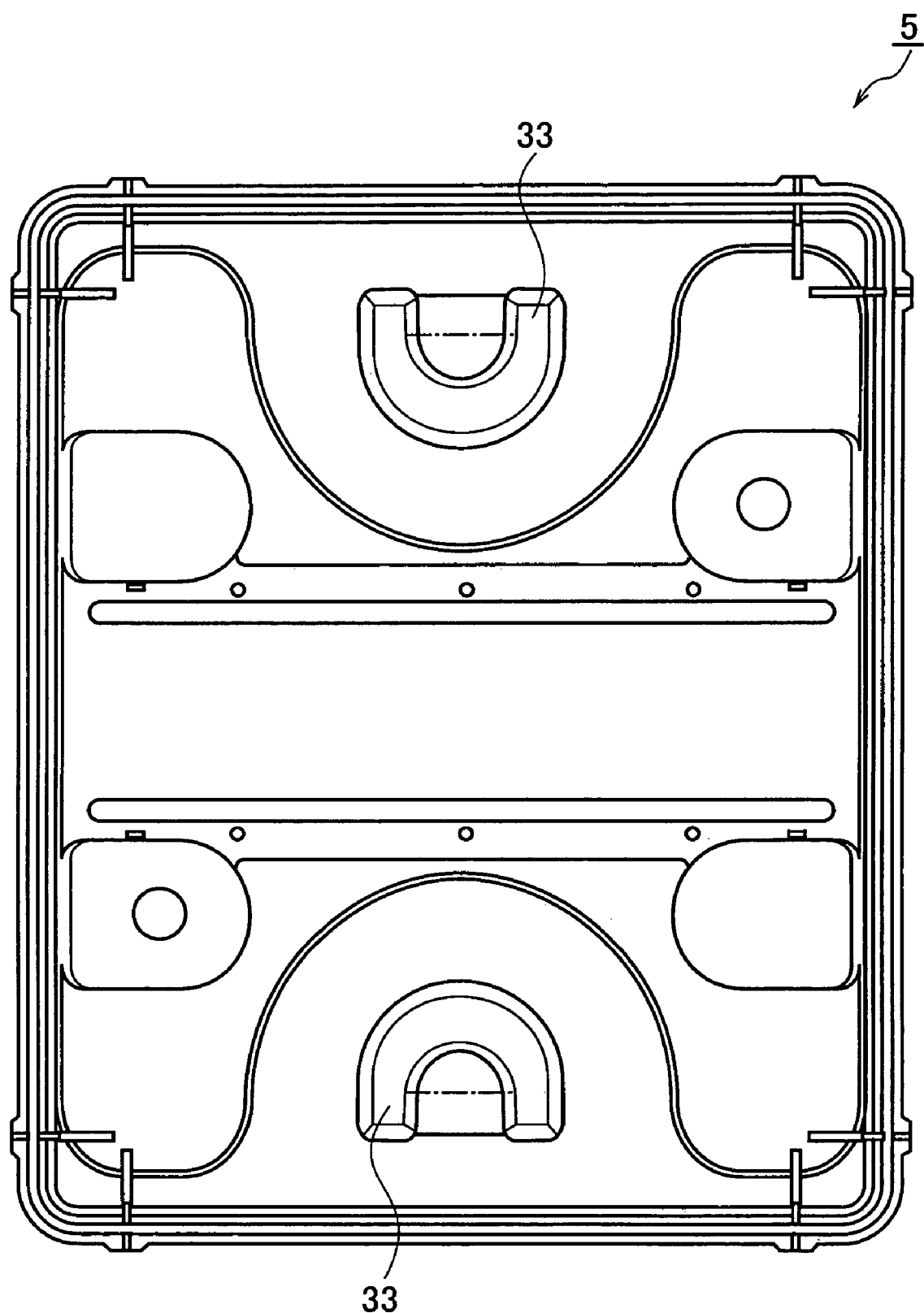
FIG. 9 is a drawing showing a backside of a lid unit for the production line.
Figure 10:
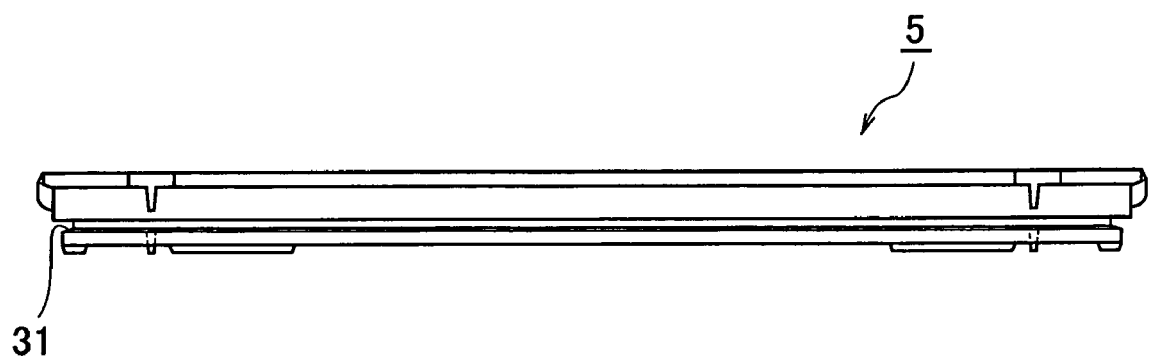
FIG. 10 is a front view showing the lid unit for the production line.
Figure 11:
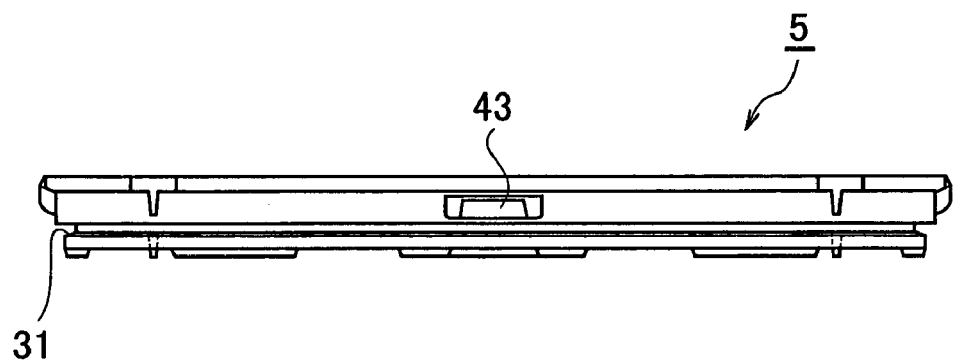
FIG. 11 is a side view showing a lid unit for the production line.
Figure 12:
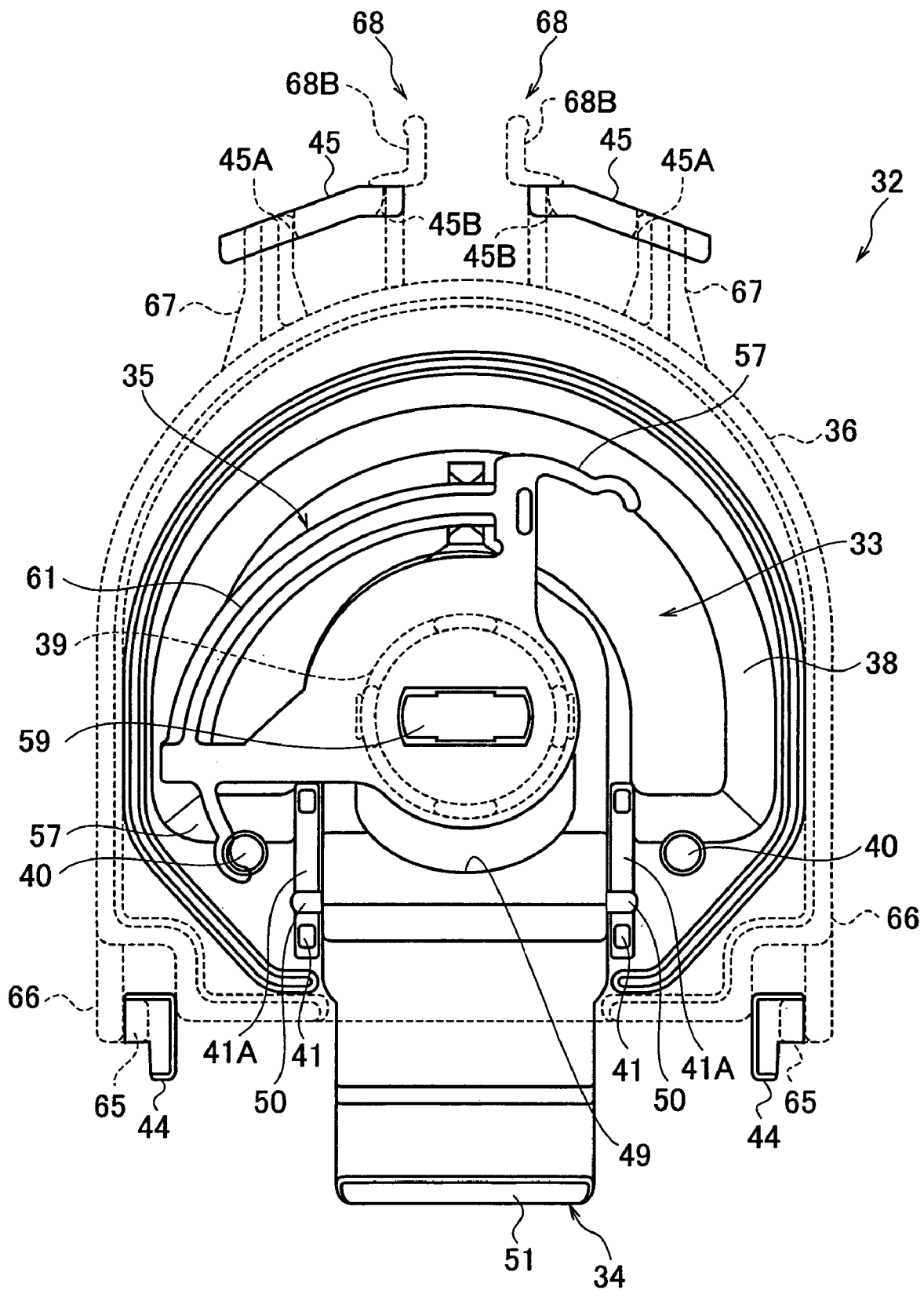
FIG. 12 is a plan view showing a simplified attaching/detaching mechanism for the production line.
Figure 13:
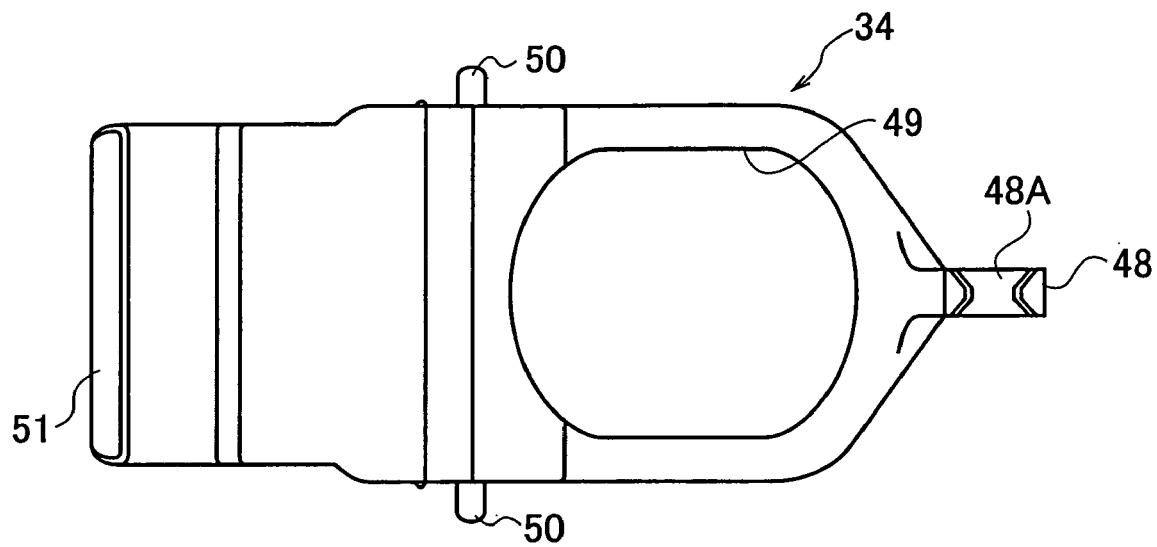
FIG. 13 is a plan view showing a locking plate.
Figure 14:
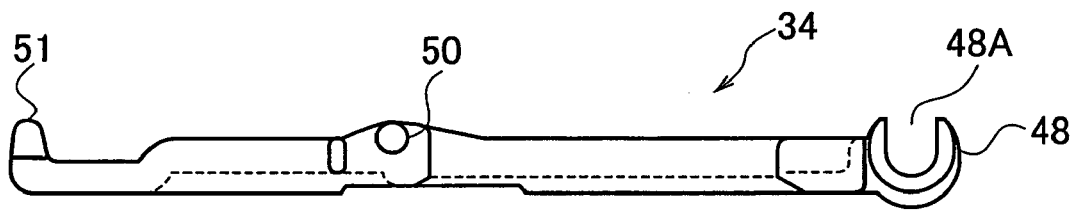
FIG. 14 is a front view showing the locking plate.
Figure 15:
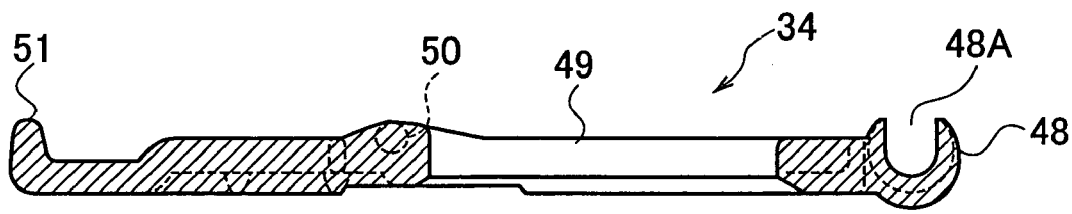
FIG. 15 is a cross sectional view showing the locking plate.
Figure 16:
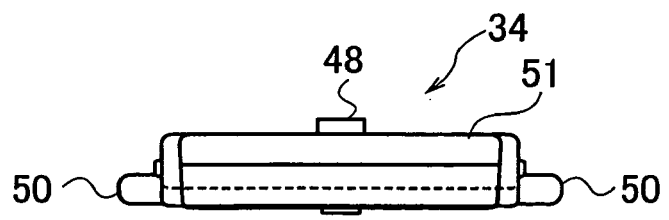
FIG. 16 is a side view showing the locking plate.
Figure 17:
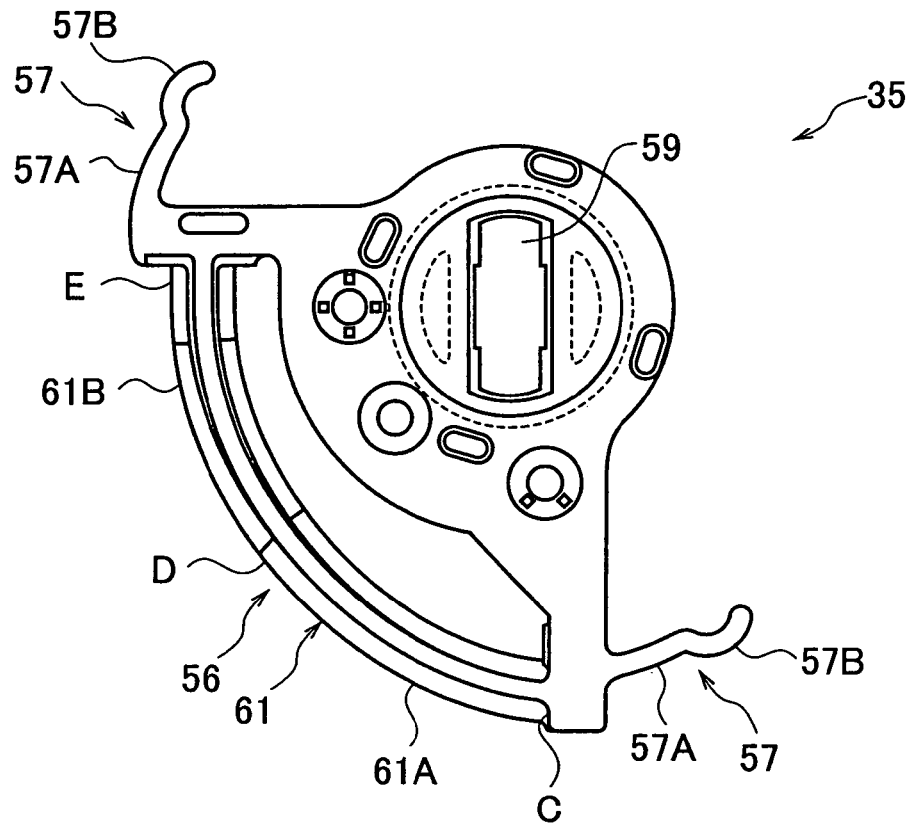
FIG. 17 is a plan view showing a drive-out member.
Figure 18:
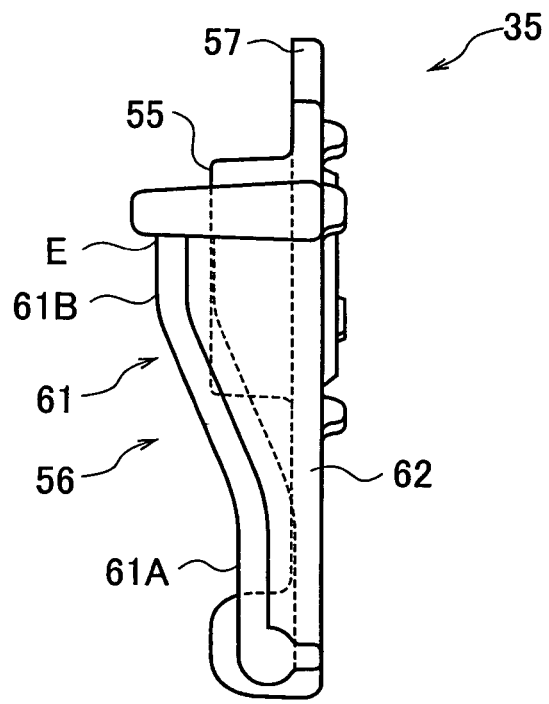
FIG. 18 is a side view showing the drive-out member.
Figure 19:
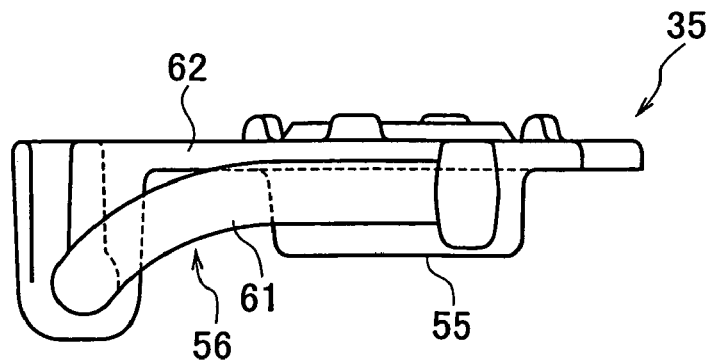
FIG. 19 is a front view showing the drive-out member.
Figure 20:
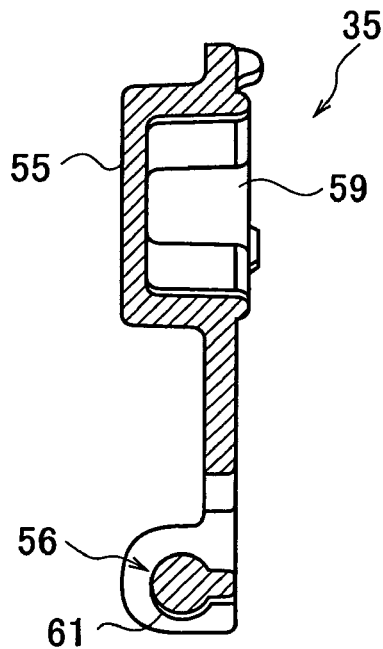
FIG. 20 is a cross sectional side view showing the drive-out member.
Figure 21:
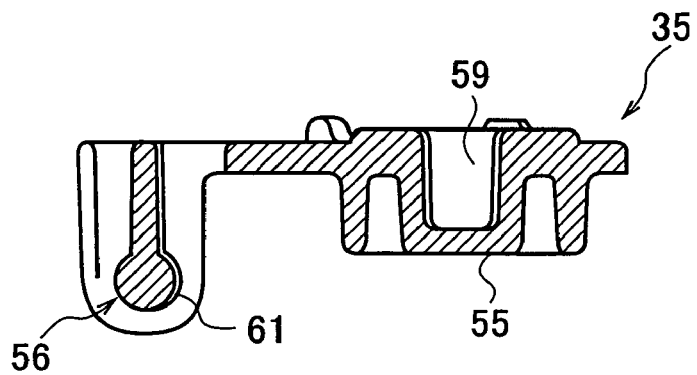
FIG. 21 is a cross sectional front view showing the drive-out member.

The body recesses 33 on the lid unit 5 for the production line are, as shown in FIGS. 1, 9 and 12, formed by depressing the centers of the longitudinal end portions outward in semi-circular shapes. The body recess 33 specifically includes an operating groove 38, a supporting cylinder 39, a locking pin 40, a supporting plate 41, an entrance groove 42, an entrance hole 43, a locking shaft bearing 44, and supporting plate 45.

The operating groove 38 accommodates the drive-out member 35 for allowing it to rotate in accordance with the operation thereof. The operating groove 38 is shaped like elongated groove curved into a semi-circular shape.

The supporting cylinder 39 is a member for supporting, rotation of the drive-out member 35 in association with the operation thereof and supporting the rising and setting movement of the locking plate 34, and is formed into a cylindrical shape. The supporting cylinder 39 is disposed at the center of the semi-circular operating groove 38.

The locking pin 40 is a pin for securing the drive-out member 35 at a preset angle. The locking pin 40 fixes the drive-out member 35 at a preset angle by being locked by the locking arm 57, which will be described later, of the drive-out member 35.

The supporting plate 41 is a plate member for supporting the rising and setting movement of the locking plate 34. Two supporting plates 41 are disposed opposingly away from each other by a distance corresponding to the width of the locking plate 34 so as to interpose the locking plate 34. The upper end portion of the supporting plate 41 is provided with a pin supporting recess 41A for supporting a pivotal movement supporting pin 50 on the locking plate 34. The pin supporting recess 41A is formed to have a length that allows back and forth movement of the pivotal movement supporting pin 50 occurring in association with the rising and setting movement of the locking plate 34. These two supporting plates 41 define the entrance groove 42. The rising and setting movement of the locking plate 34 is guided and supported by being attached to the entrance groove 42. The entrance hole 43 is formed at the tip end of the entrance groove 42. The locking plate 34 is adapted to project outward from the entrance hole 43 to engage the second fitted portion 21 of the container body 2 and fix the lid portion 5 for the production line to the container body 2.

The aforementioned operating groove 38 is defined by providing projection and recess on the single piece of lid unit 5 for the production line, and the front surface and the back surface of the lid unit 5 for the production line are never penetrated. In addition, the respective portions are formed to be a gentle line as a whole so that good water drainage is achieved.

The locking shaft bearing 44 is a member for supporting one end of the cover 36. Two locking shaft bearings 44 are provided on both sides (at the positions opposing to the locking shaft 65 of the cover 36, which will be described later) at the ends of the outsides (lower side in FIG. 12) in a state in which the cover 36 is attached. The locking shaft bearing 44 is formed by an outwardly opened notch, and adapted to support one of the ends of the cover 36 by being fitted with the locking shaft 65 of the cover 36 from outside.

The supporting plate 45 is a member for supporting the other end of the cover 36. Two supporting plates 45 are provided at the end inside (upper side in FIG. 12) in a state in which the cover 36 is attached. The supporting plate 45 includes the locking hole 45A to which a locking rod 67, which will be described later, of the cover 36 is fitted, and an engaged portion 45B with which an engaging strip 68A of the retaining rod 68, which will be described later, engages.

The locking plate 34 is a member for fixing the lid unit 5 for the production line to the container body 2. The locking plate 34 is, as shown in FIG. 12 to 16, includes an engaging hook 48, a rising and setting movement supporting hole 49, the pivotal movement supporting pin 50, and a holding claw 51.

The engaging hook 48 is formed into a C-shape, and fitted to and interconnected with a supporting rail 56, which will be described later, of the drive-out member 35. The engaging hook 48 has an opening 48A, the diameter of which is set to a value slightly smaller than the inner diameter thereof, and is slidably fitted to the supporting rail 56 having a substantially circular cross section so as not to come off.

The rising and setting movement supporting hole 49 is a hole for supporting the rising and setting movement of the locking plate 34, and is formed into an substantially oval shape at the center of the locking plate 34. The rising and setting movement supporting hole 49 is fitted to and supported by the supporting cylinder 39 of the aforementioned body recess 33.

The pivotal movement supporting pin 50 is provided on the locking plate 34 so as to project laterally therefrom, and is supported within the pin supporting recess 41A of the aforementioned supporting plate 41. In this state, the pivotal movement supporting pin 50 supports the pivotal movement and the rising and setting movement of the locking plate 34.

The holding claw 51 is a member for holding and fixing the lid unit 5 for the production line to the container body 2 by being fitted to the second fitted portion 21 of the container body 2 in a state in which the locking plate 34 is driven out by the drive-out member 35. The holding claw 51 is formed by folding the distal end portion thereof upward so that the upper end portion thereof comes into press contact with the upper surface of the aforementioned second fitted portion 21 (the state shown in FIG. 25) to press the lid unit 5 for the production line toward the container body 2 and support the same.

The drive-out member 35 drives the locking plate 34 out and allows the same to pivot upward and downward for fixing the lid unit 5 for the production line to the container body 2. The drive-out member 35 is constructed of a supporting column 55, a supporting rail 56, and a locking arm 57 as shown in FIG. 12 and FIGS. 17 to 21.

The supporting column 55 is a member for supporting rotation of the drive-out member 35. The supporting column 55 is rotatably supported by being fitted to the supporting cylinder 39 of the aforementioned body recess 33. A key groove 59 is formed on the upper surface of the supporting column 55. The key groove 59 is formed as a substantially rectangular hole, to which a T-shaped release key (not shown) of the transporting device in the plant is fitted. The release key is standardized and the key groove 59 is formed correspondingly.

The supporting rail 56 is a member to be fitted to the engaging hook 48 (follower) of the locking plate 34 for directly allowing the locking plate 34 to rise and set. The supporting rail 56 is formed in the range of about 90 degrees centered on the aforementioned supporting column 55, and includes a circular rod 61 fitted into the engaging hook 48 and a supporting plate 62 formed integrally with the circular rod 61. The circular rod 61 is formed into a radius and a height different from those of the supporting column 55. More specifically, the circular rod 61 is constructed of a driving-out portion 61A and a pushing-up (raising and lowering) portion 61B bordered at the central portion 9 thereof The driving-out portion 61A is formed in such a manner the radius from the supporting column 55 reduces gradually from the end (C position in FIG. 17) toward the central portion D, so that the locking plate 34 is driven outward when the engaging hook 48 is positioned at the central portion D and is retracted inward when the engaging hook 48 is positioned at the end C. The pushing-up portion 61B is formed in such a manner that the circular rod 61 is curved downward toward the end E to vary the height in a state in which the radius from the supporting column 55 maintained almost constant. More specifically, when the engaging hook 48 is positioned at the central portion D of the circular rod 61, the holding claw 51 at the distal end of the locking plate 34 is maintained in a lowered state, and when the engaging hook 48 is positioned at the end E of the circular rod 61, the engaging hook 48 is pressed downward to push the holding claw 51 upward (the state shown in FIG. 25). Accordingly, when the engaging hook 48 is moved from the end C of the circular rod 61 to the central portion D, the locking plate 34 is driven out from the entrance hole 43, and when it is moved from the central portion D to the end E, the holding claw 51 of the locking plate 34 in a state of being driven out from the entrance hole 43 is moved upward and brought into contact with the upper surface of the second fitted portion 21 of the container body 2 so that the lid unit 5 for the production line is pressed and fixed to the container body 2.

The locking arm 57 is a member for fixing the drive-out member 35 in a state of being rotated to the rightmost or the leftmost position. The locking arm 57 includes a resilient arm 57A formed so as to extend outward from the left and right ends of the supporting rail 56, and a arcuate locking claw 57B formed at the tip of the arm 57A for engaging the aforementioned locking pin 40.

Figure 22:
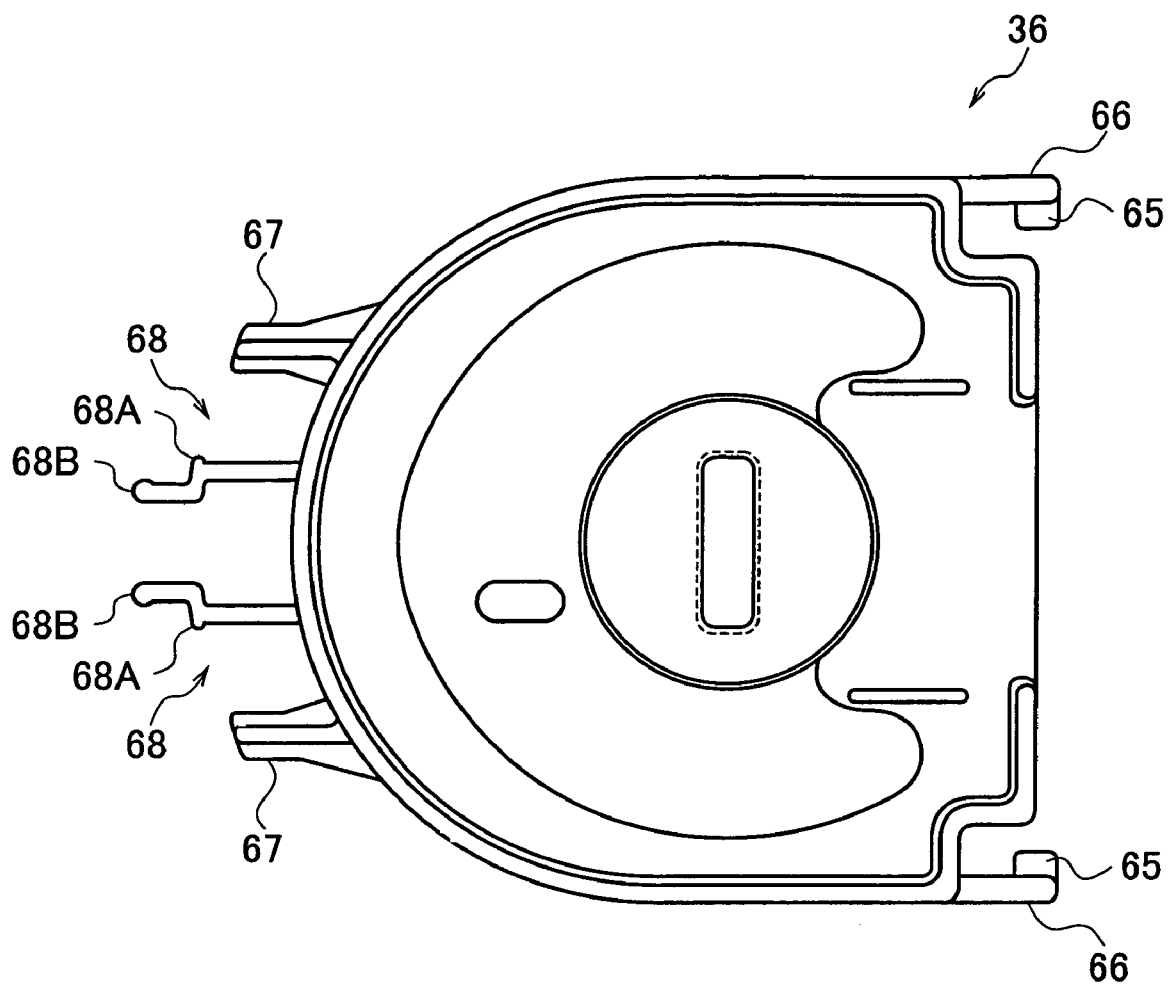
FIG. 22 is a plan view showing a cover.
Figure 23:
FIG. 23 is a cross sectional view showing the cover.

The cover 36 is a member for covering the locking plate 34 and the drive-out member 35. In other words, the cover 36 is mounted so as to cover the locking plate 34 and the drive-out member 35 in a state in which the locking plate 34 and the drive-out member 35 are attached to the body recess 33. The cover 36 is formed into a substantially semi-circular dish shape. The cover 36 is provided with a locking shaft 65 at the upper and lower ends of the proximal end (right end in FIG. 22). The locking shaft 65 is formed inwardly from the supporting plate 66, and fitted to the locking shaft bearing 44 of the body recess 33 to fix the proximal end of the cover 36 to the body recess 33. Two locking rods 67 are provided at the distal end of the cover 36, and the locking rods fix the distal end of the cover 36 to the body recess 33 by being fitted into the engaging hole 45A on the supporting plate 45 of the body recess 33. The locking shaft 65 and the locking rod 67 are adapted to be fitted to the locking shaft bearing 44 and the supporting plate 45 by moving the cover 36 inwardly (toward the supporting plate 45). Two retaining rods 68 are provided inside two locking rod 67. These two retaining rods 68 have flexibility. Specifically, the retaining rod 68 is formed to be directed outward, and includes the engaging strip 68A to be engaged with the engaged portion 45B of the supporting plate 45 and a finger strip 68B to be pinched by fingers for releasing the engaging strip 68A from the engaged portion 45B of the supporting plate 45. Engagement of the engaging strip 68A of the retaining rod 68 with the engaged portion 45B ensures fixation of the cover 36 to the body recess 33, and release of the engaging strip 68A from the engaged portion 45B enables easy disengagement of the cover 36 from the body recess 33.

The lid unit 5 for the production line is provided with a wafer holding portion 71 for supporting a semiconductor wafer accommodated in the container body 2 on the backside thereof as shown in FIG. 1. The wafer holding portion 71 includes a V-shaped holding strip 72 for supporting the semiconductor wafer by being in direct contact with the peripheral edge thereof and a supporting arm 73 for resiliently supporting the V-shaped holding strip 72.

The thin-plate holding container 1 thus constructed is used in a following manner.

The thin-plate holding container 1, in which the semiconductor wafers or the like are stored, is transported to the destination plant or the like. In this case, the lid unit 4 for transportation is attached in a state in which the semiconductor wafers or the like are stored in the container body 2. The lid unit locking claw 24 of the simplified attaching/detaching mechanism 23 for transportation of the lid unit 4 for transportation is fitted to the first fitted portion 19 of the lid unit receiving portion 17 and thus the lid unit 4 for transportation is attached to the container body 2. Accordingly, the interior of the container body 2 is completely sealed off when being transferred to the destination plant or the like.

After it has arrived at the plant or the like, an operator presses the release strip 26 of the simplified attaching/detaching mechanism 23 for transportation of the lid unit 4 for transportation downward with his/her finger to disengage the lid unit locking claw 24 from the first engaged portion 19, and then dismounts the lid unit 4 for transportation from the container body 2, and then feed the semiconductor wafers or the like stored therein to the line in the plant or the like.

Figure 24:
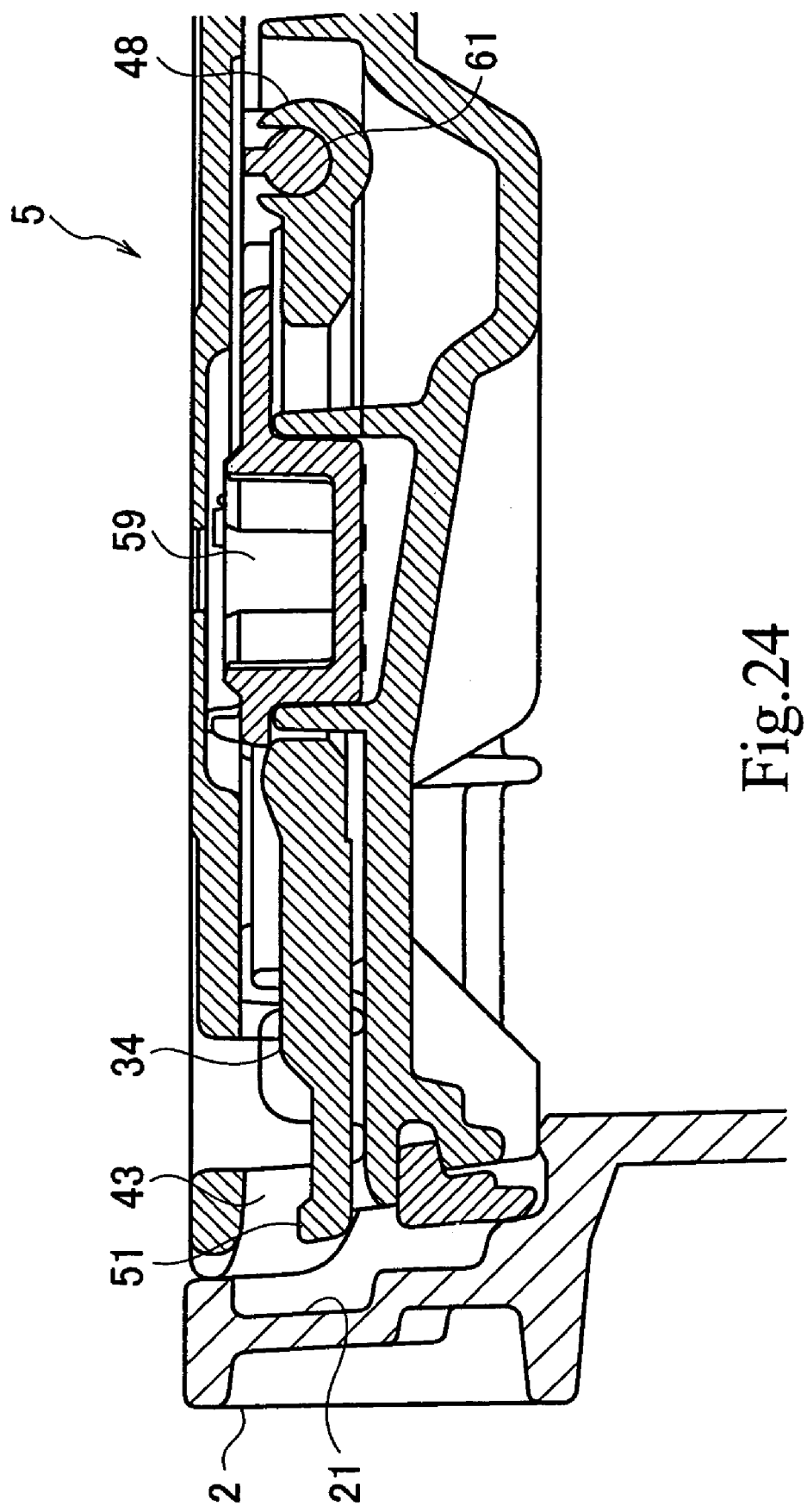
FIG. 24 is a cross sectional view of the principal portion showing a operating state of the simplified attaching/detaching mechanism for the production line.
Figure 25:
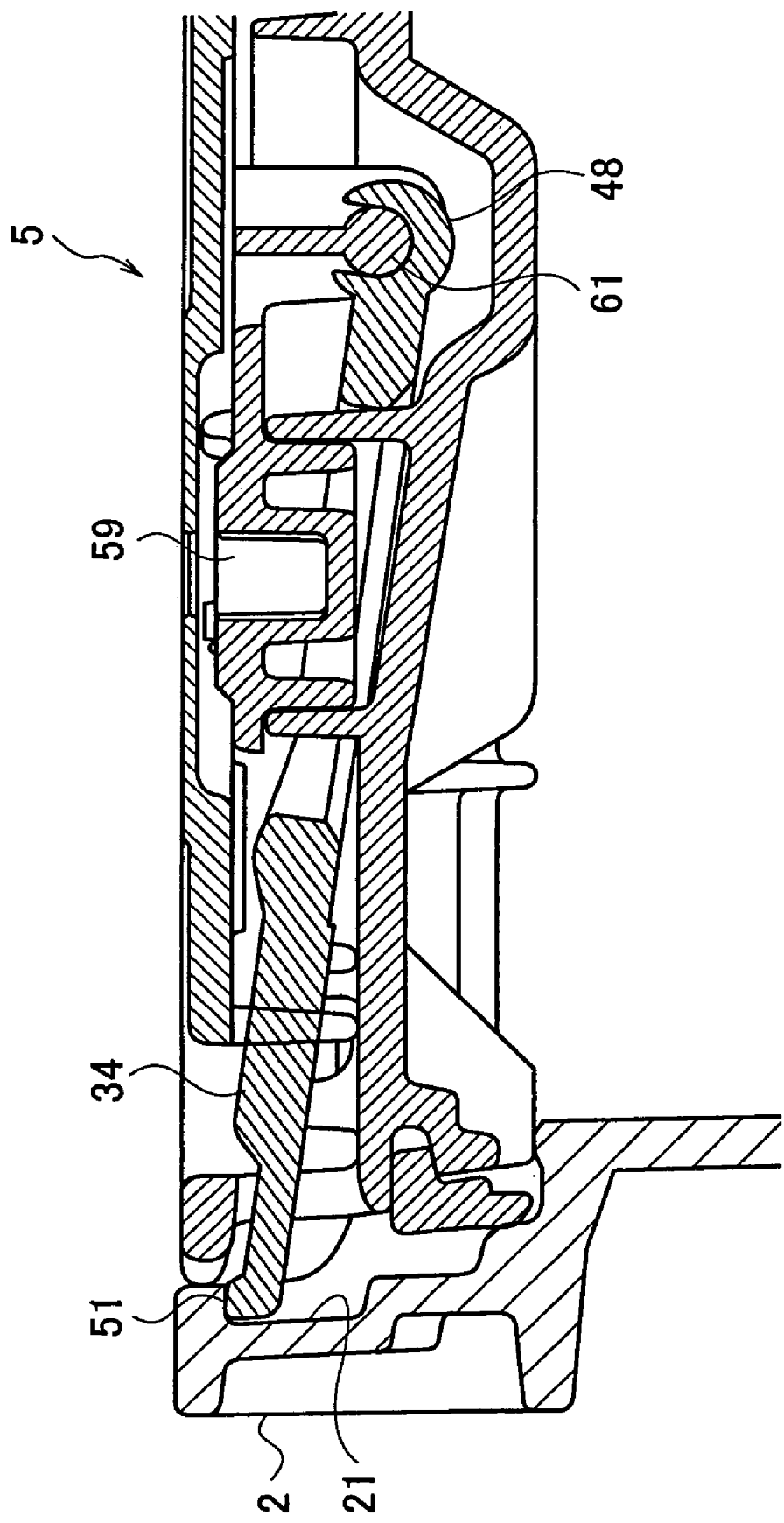
FIG. 25 is a cross sectional view of a principal portion showing the operating state of the simplified attaching/detaching mechanism for the production line.

The thin-plate holding container 1 after usage is reused. In the destination plant or the like, the container body 2 is attached with the lid unit 5 for the production line prepared in advance after washing. In other words, the lid unit 5 for the production line is attached to the lid unit receiving portion 17 of the container body 2, and the release key is inserted and turned in the ken groove 59. Accordingly, the drive-out member 35 is turned, and thus the locking plate 34 engaged with the supporting rail 56 via the engaging hook 48 is driven out by the driving-out portion 61A, and projects through the entrance hole 43 and thus inserted into the second fitted portion 21 from the state shown in FIG. 24. Subsequently, the engaging hook 48 is pushed downward by the pushing up portion 61B, and the holding claw 51 is moved upward about the pivotal movement supporting pin 50 as shown in FIG. 25 so as to be brought into contact with and pressed toward the upper surface of the second fitted portion 21. Consequently, the supporting plate 41 is pushed downward by the pivotal movement supporting pin 50, and thus the lid unit 5 for the production line is fixed to the container body 2.

In order to dismount the lid unit 5 for the production line from the container body 2, the operator inserts the release key into the key groove 59 and rotates it in the direction opposite from the direction in the case described above. Accordingly, the drive-out member 35 is turned in the opposite direction, and the engaging hook 48 moves along the supporting rail 56 in the opposite direction from the case above. In other words, the engaging hook 48 is pulled up and the holding claw 51 moves downward and thus is retracted into the cover 36. As a consequent, fixation of the lid unit 5 for the production line is released, and thus the operator dismounts it from the container body 2. In this manner, the container body 2 is reused, from the container for transportation, for the production line in the plant or the like.

The lid unit 4 for transportation is sent back because it is not bulky, and is used again for the transportation of the semiconductor wafer and the like.

Although the semiconductor wafer is taken as an example in the embodiment described above, the same advantages and effects as in the above-described embodiment may be expected also in the case where other types of thin-plates such as the memory disk, and the liquid crystal glass substrate are used.

As described in detail above, according to the thin-plate holding container of the invention, the following effects are achieved.

(1) Since the lid unit 5 for the production line is used together with the lid unit 4 for transportation, the container body 2 can be used for the thin-plate holding container 1 for transportation, as well as for the thin-plate holding container 1 for the production line.

As a consequent, efficiency of usage is improved, waste of resources is prevented, and generation of waste products is prevented.

(2) Since the simplified attaching/detaching mechanism 32 for the production line is provided on the lid unit 5 for the production line, the lid unit 5 for the production line may be attached to the container body 2 prepared for transportation via the simplified attaching/detaching mechanism 32 for the production line, and thus the container body 2 used for transportation may be used for the production line as is.

(3) Since the simplified attaching/detaching mechanism 32 for the production line is constructed of the locking plate 34 to be engaged with the second fitted portion 21 of the container body 2 and the drive-out member 35 to be engaged with the locking plate 34 for allowing it to rise and set, the lid unit 5 for the production line may easily be attached to and detached from the container body 2 by allowing the locking plate 34 to rise and set with respect to the second fitted portion 21 by means of the drive-out member 35.

(4) Since the locking arm 57 is provided at the end of the drive-out member 35 in the direction of rotation, the drive-out member 35 may be reliably fixed at the predetermined position after being rotated.

(5) Since the supporting rail 56 for controlling rising and setting of the locking plate 34 is provided on the drive-out member 35, rising and setting movement of the locking plate 34 is controlled by the supporting rail 56, and thus the lid unit 5 for the production line may be reliably fixed and reliably released from fixation.

(6) Since the locking plate 34 is supported pivotally and slidably, the lid unit 5 for the production line may be reliably fixed to the container body 2 by allowing the locking plate 34 to slide into the container body 2, and then to pivot to be brought into contact with the container body 2.

(7) Since the locking plate 34 is provided with a holding claw 51 to be engages with the container body 2 at the distal end thereof, the lid unit 5 of the production line may be pressed toward and reliably fixed to the container body 2 by engaging the holding claw 51 with the second fitted portion 21 of the container body 2.

(8) Since the lid unit 5 for the production line is used as a lid unit for the thin-plate holding container 1, the thin-plate holding container 1 may also be used for the production line in the plant or the like after having been used for transportation.

INDUSTRIAL APPLICABILITY

As described thus far, the thin-plate holding container 1 according to the present invention is useful for a carrier for transporting semiconductor wafers, hard memory disks (magnet disks), base bodies of compact disks (CD), which must be absolutely protected from occurrence of dust and the like. In addition to it, it is also useful for a carrier for transporting these products in the process of producing them.

The invention claimed is:

1. A simplified attaching/detaching mechanism for detachably fixing a lid unit, having a planar body, to a container body, comprising:

a locking plate slidably supported on the lid unit for sliding movement, in a linear direction, between an engaged position where a distal end of the locking plate is extended within receiving structure of the container body and a disengaged position retracted from contact with the container body, the locking plate having a follower at an end opposite the distal end; and a drive-out member for producing the sliding movement, thereby extending the locking plate to the engaged position and retracting the locking plate to the disengaged position, and for raising the distal end of the locking plate within the receiving structure in a direction perpendicular to the linear direction, thereby forcing the lid unit against the container body, the drive-out member being mounted on the lid unit for rotation relative to the lid unit about an rotational axis oriented perpendicular to the linear direction and to the planar body of the lid unit, the drive-out member including a support rail slidably engaged by the follower of the locking plate to translate rotary motion of the drive-out member into the extending, retracting and raising movements of the locking plate, whereby rotation of the drive-out member slidably moves the locking plate relative to the rotational axis of the drive-out member; and wherein:

the support rail is curved and comprises:

a driving portion, wherein the distance between the support rail and the fixed axis changes along its length, for driving the locking plate outward to its engaged position when the drive-out member with the support rail is rotated in one direction and for retracting the locking plate inward when the drive-out member with the support rail is rotated in the other direction; and a raising and lowering portion, wherein the distance between the support rail and a surface of the lid unit changes along its length, for pushing the distal end of the locking plate up, away from the lid unit, when further rotated in the one direction and for pushing the distal end of the locking plate down when rotated in the other direction; and wherein the locking plate includes, extending from opposing sides thereof, a pair of pivot pins slidably supported on the lid unit, the locking plate being slidably and pivotally supported by the pair of pivot pins, whereby the locking plate is pivoted for the up and down movement of its distal end.

2. A simplified attaching/detaching mechanism for detachably fixing a lid unit, having a planar body, to a container body, comprising:

a locking plate slidably supported on the lid unit for sliding movement, in a linear direction, between an engaged position where a distal end of the locking plate is extended within receiving structure of the container body and a disengaged position retracted from contact with the container body, the locking plate having a follower at an end opposite the distal end; and a drive-out member for producing the sliding movement, thereby extending the locking plate to the engaged position and retracting the locking plate to the disengaged position, and for raising the distal end of the locking plate within the receiving structure in a direction perpendicular to the linear direction, thereby forcing the lid unit against the container body, the drive-out member being mounted on the lid unit for rotation relative to the lid unit about an rotational axis oriented perpendicular to the linear direction and to the planar body of the lid unit, the drive-out member including a support rail slidably engaged by the follower of the locking plate to translate rotary motion of the drive-out member into the sliding and raising movements of the locking plate, whereby rotation of the drive-out member slidably moves the locking plate relative to the rotational axis of the drive-out member, wherein the locking plate includes, extending from opposing sides thereof, a pair of pivot pins slidably supported on the lid unit, the locking plate being slidably and pivotally supported by the pair of pivot pins, whereby the locking plate is pivoted for the up and down movement of its distal end.

3. A simplified attaching/detaching mechanism according to claim 1, wherein the drive-out member includes a locking arm, extending therefrom to a free end for resiliently engaging a fixed structure on the lid unit, thereby holding the drive-out member against rotation.

4. A simplified attaching/detaching mechanism according to claim 1, wherein the distal end of the locking plate comprises a holding claw for fitting into the receiving structure of the container body to fix the lid unit to the container body, the holding claw depending from the distal end thereof.

* * * * *